United States Patent
Saito et al.

(10) Patent No.: US 7,049,658 B2
(45) Date of Patent: May 23, 2006

(54) POWER SEMICONDUCTOR DEVICE

(75) Inventors: Wataru Saito, Kawasaki (JP); Ichiro Omura, Yokohama (JP); Tsuneo Ogura, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 10/602,596

(22) Filed: Jun. 25, 2003

(65) Prior Publication Data

US 2004/0129973 A1    Jul. 8, 2004

(30) Foreign Application Priority Data

Jan. 7, 2003    (JP) .............................. 2003-001494

(51) Int. Cl.
 *H01L 29/94* (2006.01)
(52) U.S. Cl. ...................... 257/341; 257/335
(58) Field of Classification Search ................ 257/341, 257/335, 339, 342
See application file for complete search history.

(56) References Cited

U.S. PATENT DOCUMENTS

| | | | |
|---|---|---|---|
| 5,438,215 A | 8/1995 | Tihanyi | |
| 6,081,009 A * | 6/2000 | Neilson | 257/341 |
| 6,291,856 B1 * | 9/2001 | Miyasaka et al. | 257/335 |
| 6,410,958 B1 * | 6/2002 | Usui et al. | 257/329 |
| 6,674,126 B1 * | 1/2004 | Iwamoto et al. | 257/341 |
| 6,677,643 B1 * | 1/2004 | Iwamoto et al. | 257/341 |
| 6,693,338 B1 * | 2/2004 | Saitoh et al. | 257/492 |
| 2002/0175368 A1 * | 11/2002 | Izumisawa et al. | 257/341 |
| 2003/0094649 A1 * | 5/2003 | Hueting et al. | 257/328 |
| 2003/0193067 A1 * | 10/2003 | Kim et al. | 257/343 |
| 2004/0016959 A1 * | 1/2004 | Yamaguchi et al. | 257/327 |
| 2004/0065921 A1 * | 4/2004 | Iwamoto et al. | 257/341 |

FOREIGN PATENT DOCUMENTS

| | | |
|---|---|---|
| JP | 2001-501042 | 1/2001 |
| JP | 2001-60685 | 3/2001 |
| JP | 2001-102577 | 4/2001 |
| JP | 2002-246595 | 8/2002 |

* cited by examiner

*Primary Examiner*—Douglas W. Owens
(74) *Attorney, Agent, or Firm*—Oblon, Spivak, McClelland, Maier & Neustadt, P.C.

(57) ABSTRACT

Disclosed is a power semiconductor device, including a first semiconductor layer of a first conductivity type, a second semiconductor layer of the first conductivity type and a third semiconductor layer of a second conductivity type which are alternately and laterally arranged on the first semiconductor layer and, a fourth semiconductor layer of the second conductivity type selectively formed in the surface regions of the second and third semiconductor layers, a fifth semiconductor layer of the first conductivity type selectively formed in the surface region of the fourth semiconductor layer, and a control electrode formed on the surfaces of the second, fourth and fifth semiconductor layers, in which a layer thickness ratio A is given by the expression:

$$0 < A = t/(t+d) \leq 0.72$$

where t is the thickness of the first semiconductor layer, and d is the thickness of the second semiconductor layer.

27 Claims, 10 Drawing Sheets

POWER SEMICONDUCTOR DEVICE

CROSS-REFERENCE TO RELATED APPLICATIONS

This application is based upon and claims the benefit of priority from prior Japanese Patent Application No. 2003-1494, filed Jan. 7, 2003, the entire contents of which are incorporated herein by reference.

BACKGROUND OF THE INVENTION

1. Field of the Invention

The present invention relates to a power semiconductor device for use in handling high electric power, and more particularly, to a power semiconductor device comprising a vertical-type power MOSFET with a superjunction structure.

2. Description of the Related Art

In one type of the power semiconductor devices such as a vertical-type power MOSFET, the on-resistance thereof depends on the electric resistance of a conductive layer or the drift layer. The doped impurity concentration which determines the electric resistance of the drift layer depends on the breakdown voltage of the PN junction formed between the base layer and the drift layer, and so cannot be increased beyond a certain limit. In other words, there is a so-called trade-off relationship between the breakdown voltage and the on-resistance. To obtain a semiconductor device that wastes only a small amount of power, the trade-off must be improved. The improvement of the trade-off is limited by the material used in the device. To achieve a power semiconductor device having an on-resistance lower than that of a conventional device, it is necessary to improve the trade-off beyond the limit.

It is known that this problem can be overcome by a MOSFET having a RESURF structure or a superjunction structure, which is a structure in which p-type pillar layers and n-type pillar layers are repeatedly arranged, buried within the drift layer.

FIG. 15 is a schematic sectional view showing the structure of a vertical-type power MOSFET having a RESURF structure.

In the MOSFET, an n$^+$ type drain layer (n$^+$ substrate) 101 is formed on one surface of the n-type pillar layer 103. On the other surface of the n$^+$ type drain layer 101, a drain electrode 105 is formed. In the other surface region of the n-type pillar layer 103, a plurality of p-type base layers 106 are selectively formed. In the surface region of each p-type base layer 106, n$^+$ type source layers 107 are selectively formed. On the surface region of the n-type pillar layer 103 between two n$^+$ type source layers 107 provided in adjacent two p-type base layers 106, a gate electrode 110 is formed via a gate insulating film 109.

In addition, a source electrode 108 is formed on the n$^+$ type source layers 107 formed in each of the p-type base layers, so as to sandwich the gate electrode 110 between the source electrodes 108. In the n-type pillar layer 103 between the p-type base layer 106 and the drain layer 101, p-type pillars 104 in contact with the p-type base layers 106 are formed. In short, pn junctions formed between the n-type pillar layers 103 and the p-type pillars 104 are arranged alternately in the lateral direction throughout the entire drift layer. This is called a vertical-type RESURF structure or a so-called superjunction structure.

In a MOSFET having such a superjunction structure, the impurity concentration of the n-type pillar layer 103 can be increased by reducing the interval (cell width) between adjacent pillars 104, thereby reducing the on-resistance.

A process for burying the pillars 104 of the superjunction structure in the MOSFET will now be described more specifically. In an n-type layer formed on an Si substrate by the epitaxially growing method boron ions are selectively implanted into a surface portions of the n-type layer at which the pillars are being formed. The n-type layer is then allowed to grow epitaxially to bury the boron ions implanted into the n-type layer. Again, boron ions are selectively implanted into the same surface portions of the n-type layer grown epitaxially in the above step and the n-type layer is again allowed to grow epitaxially. As described, this process which is called as injection/epitaxial growth of boron-ion implantation and epitaxial growth is repeated a plurality of times, and the resultant structure is heat treated to diffuse the injected boron ions. In this way, the p-type pillars 104 extending in the vertical direction, as seen in the sectional view of FIG. 15, is formed.

However, a method of forming such a superjunction structure within the drift layer requires a complicated manufacturing process of repeating n-type layer epitaxial growth and p-type impurity implantation alternately. Because of this, the wafer manufacturing cost becomes higher than that of conventional power MOSFETs.

As described above, the on-resistance can be reduced by reducing the cell width or the interval of the pillars 104. However, to reduce the cell width, the depth and width of the boron ions implanted each time must be reduced and, instead, implantation/epitaxial growth must be repeated more. As a result, the wafer manufacturing cost increases.

The structure of a MOSFET having a superjunction structure is disclosed in, for example, National Patent Publication No. P2001-501042A.

A vertical-type power MOSFET having a conventional superjunction structure formed therein has the disadvantage that a complicated manufacturing process is required in order to reduce the cell width, that is, to reduce the on-resistance.

BRIEF SUMMARY OF THE INVENTION

According to a first aspect of the present invention, there is provided a semiconductor device, comprising: a first semiconductor layer of a first conductivity type; a second semiconductor layer of the first conductivity type and a third semiconductor layer of a second conductivity type which are alternately and laterally arranged on the first semiconductor layer and; a first main electrode electrically in contact with the first semiconductor layer; a fourth semiconductor layer of the second conductivity type selectively formed in surface regions of the second and third semiconductor layers; a fifth semiconductor layer of the first conductivity type selectively formed in a surface region of the fourth semiconductor layer; a second main electrode formed in contact with surfaces of the fourth and fifth semiconductor layers; and a control electrode formed on surfaces of the second, fourth and fifth semiconductor layers, in which an impurity concentration of the first semiconductor layer is lower than that of the second semiconductor layer; and a layer thickness ratio A is given by an expression:

$$0 < A = t/(t+d) \leq 0.72$$

where t is a thickness of the first semiconductor layer, and d is a thickness of the second semiconductor layer.

DETAILED DESCRIPTION OF THE INVENTION

Figure 1:
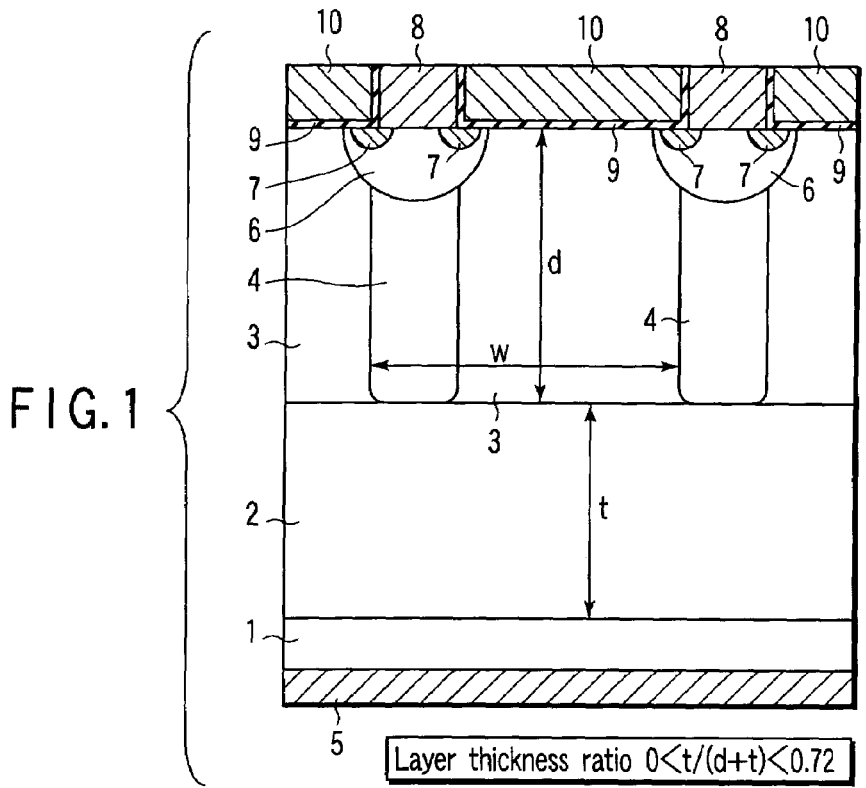
FIG. 1 is a schematic sectional view showing a vertical-type power MOSFET structure having a superjunction structure according to a first embodiment of the present invention.

Now, embodiments of the present invention will be described in detail with reference to the accompanying drawings. Note that a first conductivity type is an n-type and a second conductivity type is a p-type in the following embodiments. Like reference numerals are used to designate like structural elements in the drawings.

<First Embodiment>

FIG. 1 is a schematic sectional view showing a vertical-type power MOSFET structure having a superjunction structure according to a first embodiment of the present invention.

On one surface of an n⁻ drift layer 2, an n-type pillar layer 3, and p-type pillars 4 are formed. The pillar layer 3 and the pillars 4 form a superjunction structure. On the other surface of the n⁻ drift layer 2, an n⁺ drain layer 1 of a highly doped semiconductor layer is formed. Further on the rear surface of the n⁺ drain layer 1, a drain electrode 5 serving as a first main electrode is formed.

The n⁺ drain layer 1 may be formed by diffusing impurity ions into the rear surface of the n⁻ drift layer 2. Or, the n⁻ drift layer 2 may be grown epitaxially on the n⁺ drain layer 1 used as a substrate.

In the surface region of the superjunction structure, p-type base layers 6 are selectively formed by a diffusion process of impurities. The p-type base layers 6 has a stripe shape in the plan view in a direction perpendicular to the drawing. In the surface region of each p-type base layer 6, two n⁺ type source layers 7 having a stripe form in plan view parallel to the base layers 6 are selectively formed.

On the region of each n-type pillar layer 3 between adjacent two n⁺ type source layers 7 respectively formed in the adjacent two p-type base layers 6, a gate electrode 10 of a stripe-form serving as a control electrode is formed via a gate insulating film 9 of Si oxide film, for example, of about 0.1 μm thick.

Further, source electrodes 8 of a stripe-form serving as a second main electrode are formed on the p-type base layers 6 in contact with the surfaces of the p-type base layers 6 and the n⁺ source layers 7 such that the gate electrode 10 is sandwiched by adjacent two source electrodes 8 via the gate insulating film 9.

As described above, the MOSFET of this embodiment includes a superjunction structure formed of the n-type pillar layer 3 and the p-type pillars 4, and a drift layer formed of the n⁻ drift layer 2.

When a high voltage is applied between the first main electrode formed of the drain electrode 5 and the second main electrodes formed of the source electrodes 8, the superjunction structure formed of the n-type pillar layer 3 and the p-type pillars 4 is completely depleted. Since the breakdown voltage of this power device is determined by these two regions, that is, the superjunction structure and the n⁻ drift layer 2, the superjunction structure can be reduced in thickness compared to a conventional one. Therefore, when the superjunction structure having the same aspect ratio as that of the conventional one is formed by repeating the ion implantation/epitaxial growth, the number of repeat times can be reduced compared to the conventional one. As a result, the manufacturing process can be simplified, with the result that the wafer cost can be reduced.

Figure 2:
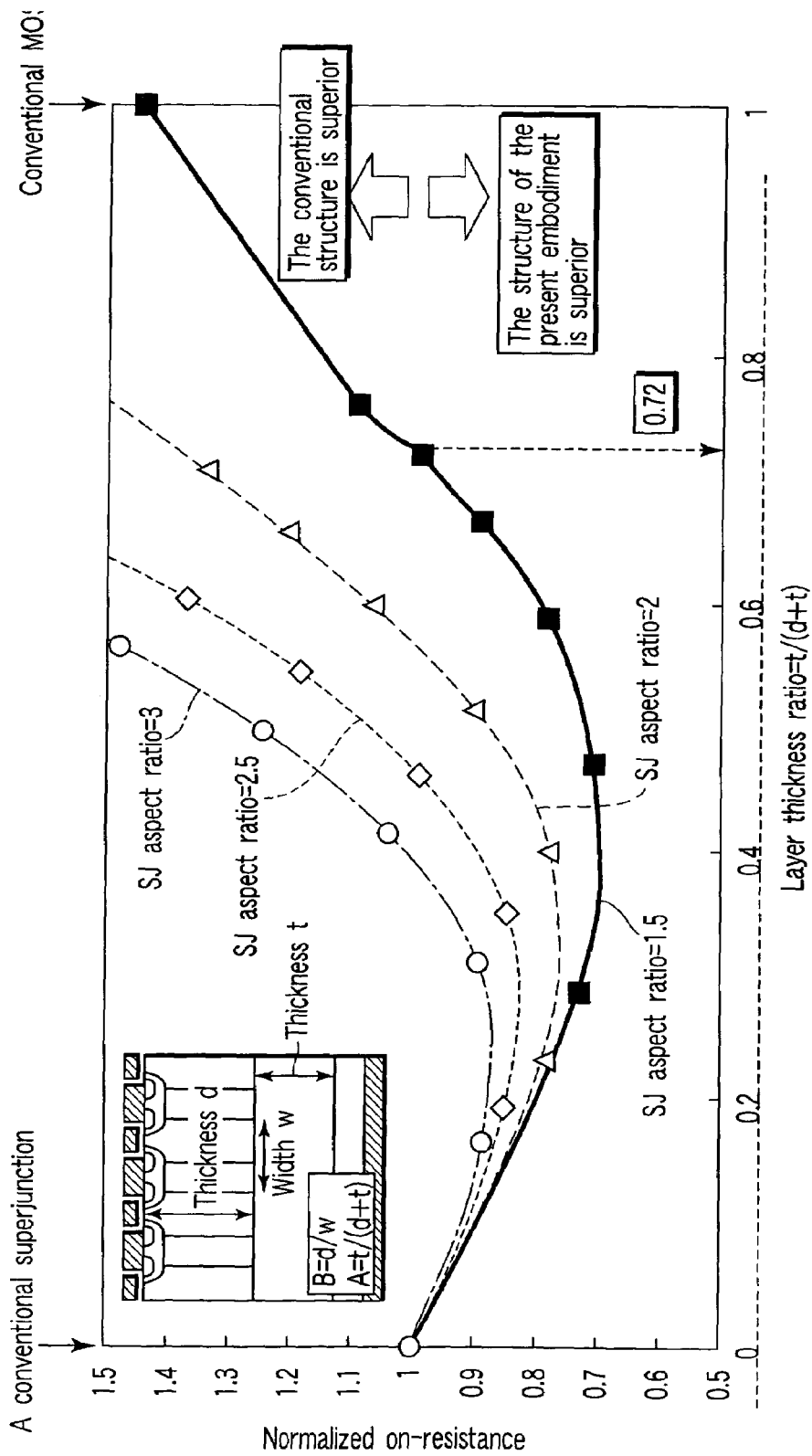
FIG. 2 is a characteristic graph showing the on-resistance versus the layer thickness ratio by varying the thickness of the n⁻ drift layer of FIG. 1.

FIG. 2 is a characteristic graph showing the on-resistance versus the thickness of the n⁻ drift layer 2 of FIG. 1. The abscissa indicates a layer-thickness ratio of the n⁻ drift layer 2 to the entire drift layer, represented by $A=t/(t+d)$, where t is the thickness of the $n^-$ drift layer 2, and d is the thickness of the superjunction structure. The ordinate indicates the on-resistance normalized by the on-resistance of a conventional superjunction MOSFET.

Using the aspect ratio of the superjunction (SJ) structure as a parameter, in other word, a ratio of d/w where d is the same as defined above and w is the interval between adjacent p-type pillars 4 (see FIG. 2, upper-left portion), FIG. 2 shows the on-resistances of the cases where SJ aspect ratios are 1.5, 2, 2.5 and 3 are shown.

As is apparent from FIG. 2, the normalized on-resistance value (indicated on the ordinate) of 1 or less means that the on-resistance of the structure of this embodiment is lower than that of a conventional one.

To obtain the advantages of the superjunction structure, the aspect ratio B is desirably 1.5 or more. When the aspect ratio B is 1.5, if the layer-thickness ratio A is set so as to fall the range between more than 0 and 0.72 or less ($0<A=t/(t+d)\leq0.72$), the on-resistance of the resultant superjunction MOSFET becomes lower than that of a conventional one. In brief, the superjunction structure having the same aspect ratio as that of the conventional one and exhibiting a lower on-resistance means that a low on-resistance can be obtained without increasing the number of process steps or without making the process steps more complicated.

As is apparent from FIG. 2, when the aspect ratio B of the superjunction structure changes, the range of the layer-thickness ratio A in which the on-resistance of the superjunction MOSFET of the present embodiment is lower than that of the conventional superjunction MOSFET varies. Conversely, when the layer-thickness ratio A is varied, there is the layer thickness (the aspect ratio) exhibiting the lowest on-resistance.

Figure 3:
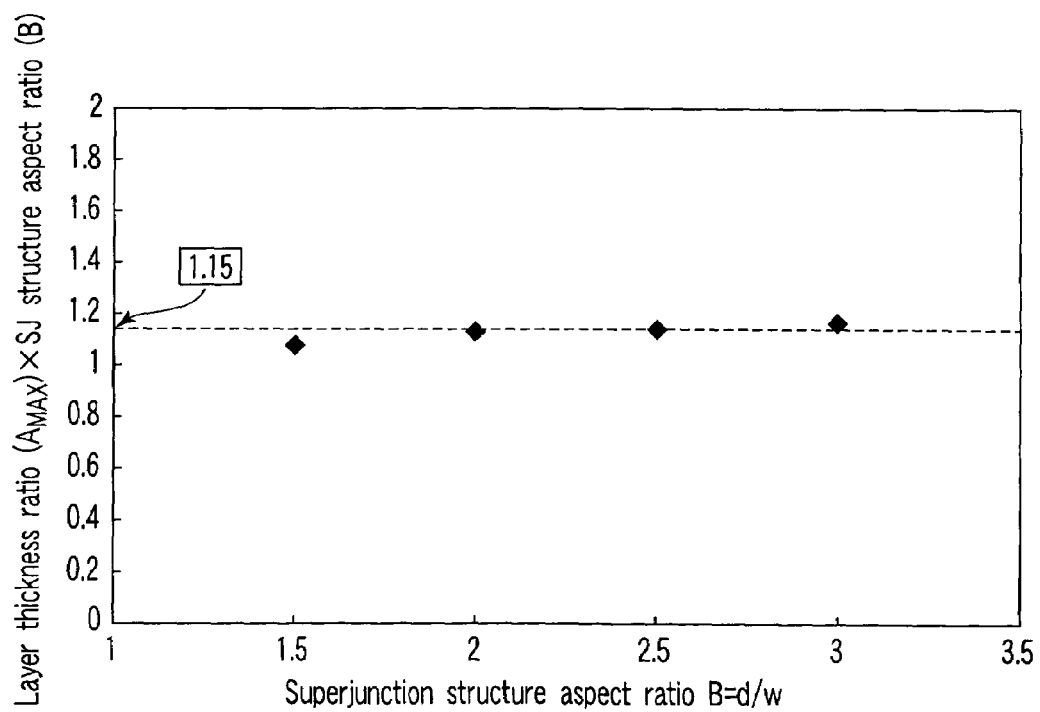
FIG. 3 is a characteristic graph showing the dependency of a product of $A_{MAX} \times B$ upon an aspect ratio B of the superjunction (SJ) structure, where $A_{MAX}$ is the maximum layer thickness ratio at which the MOSFET of FIG. 1 exhibits an on-resistance lower than a conventional superjunction structure.

FIG. 3 is a characteristic graph showing the dependency of a product of $A_{MAX} \times B$ upon the aspect ratio B, where $A_{MAX}$ is the maximum layer thickness ratio at which the MOSFET of FIG. 1 exhibits a lower on-resistance than a conventional superjunction structure, and B is an aspect ratio of the superjunction structure.

As is apparent from FIG. 3, even if the aspect ratio B changes, the product of $A_{MAX}$ (maximum layer thickness ratio)×B (aspect ratio) does not change and keeps a constant value of about 1.15. Therefore, if a semiconductor device is formed so as to satisfy the product of $A_{MAX} \times B$ at 1.15 or less, the on-resistance of the resultant superjunction MOSFET can be reduced from that of the conventional one.

Figure 4:
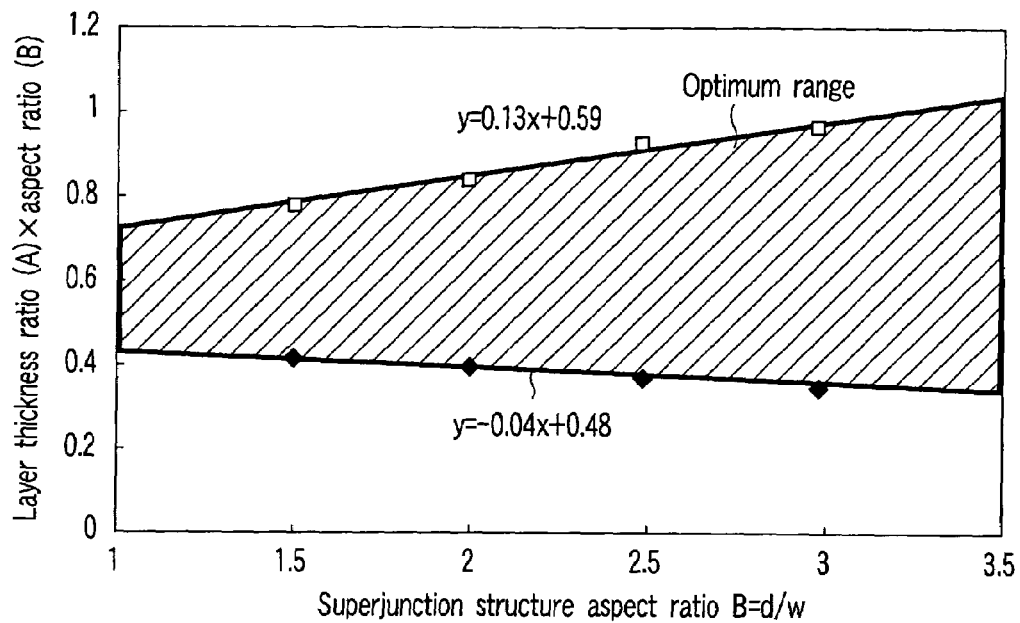
FIG. 4 is a characteristic graph showing the dependency of the product of A×B upon the aspect ration B, where A is a layer-thickness ratio, and B is the aspect ratio of the superjunction structure in the MOSFET shown in FIG. 1, the hatched portion showing an optimum range in which the on-resistance of the superjunction structure varies from the lowest value up to +5% value.

FIG. 4 is a characteristic graph showing the dependency of the product of A×B upon B, where A is a layer-thickness ratio, and B is the aspect ratio of the superjunction structure in the MOSFET shown in FIG. 1. The hatched portion of FIG. 4 shows an optimum or a desirable range of the on-resistance of the superjunction structure in which the on resistance is varied from the lowest value up to +5% thereof.

As is apparent from FIG. 4, a superjunction structure is desirably designed such that the product of the layer-thickness ratio A and the aspect ratio B falls within the desirable range hatched in the graph. The hatched portion is represented by:

$$-0.04B+0.48<(A\times B)<0.13B+0.59 \quad (1)$$

Figure 5:
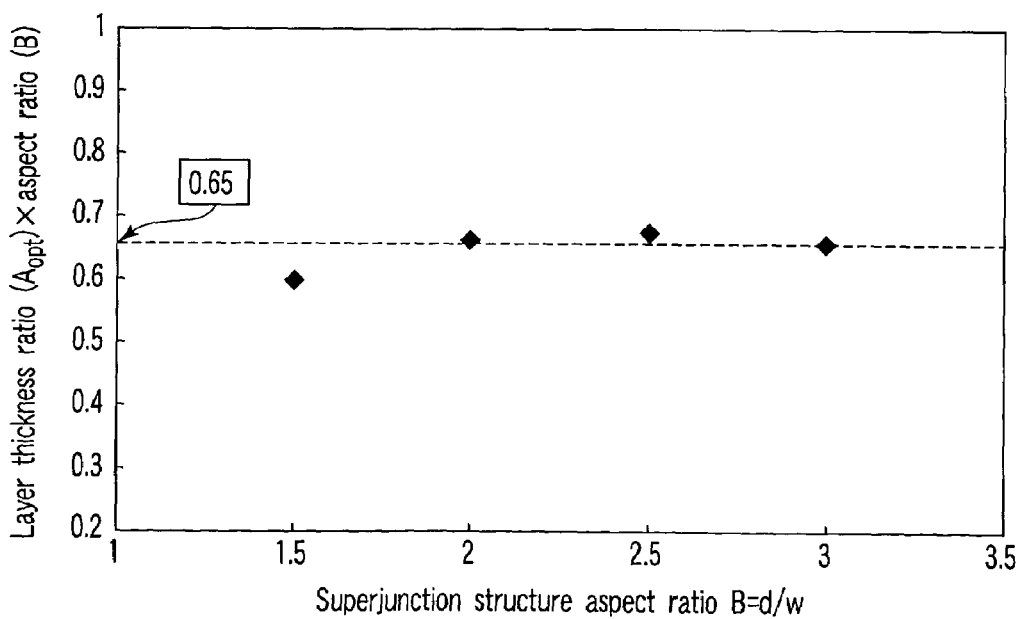
FIG. 5 is a characteristic graph showing the dependency of Aopt×B upon B, where Aopt is the optimum layer-thickness ratio at which the on-resistance of the MOSFET of FIG. 1 becomes the lowest, and B is the aspect ratio of the superjunction structure.

FIG. 5 is a characteristic graph showing the dependency of Aopt×B upon B, where Aopt is the optimum layer-thickness ratio at which the MOSFET of FIG. 1 shows the lowest on-resistance, and B is the aspect ratio of the superjunction structure.

As is apparent from FIG. 5, according to this embodiment, the product of Aopt×B is constant independently of the value of B. The lowest on-resistance can be attained by setting the product Aopt×B at about 0.65. Taking a process margin of about 10% into consideration, the product A×B desirably falls within the following range:

$$0.58<A\times B<0.71 \quad (2)$$

Next, the design of the $n^-$ drift layer 2 shown in FIG. 1 will be described more specifically.

The thickness t and the impurity concentration Nn of the $n^-$ drift layer 2 can be designed in the similar manner as in the drift layer of a conventional power MOSFET.

The relationship between the layer-thickness td and the breakdown voltage VB of the drift layer of the conventional power MOSFET is known to be represented by the following equation:

$$td=C\times VB^{7/6} \text{ (cm)} \quad (3)$$

where C is a constant.

In the conventional power MOSFET, the overall breakdown voltage is owed in the drift layer, whereas, in the MOSFET of this embodiment, the breakdown voltage is owed by both the $n^-$ drift layer 2 and the superjunction structure. Since the breakdown voltage owed by the $n^-$ drift layer 2 changes almost in proportional to the layer-thickness ratio A, the thickness t of the $n^-$ drift layer 2 can be expressed by:

$$t=Ct\times(A\times VB)^{7/6} \text{ (cm)} \quad (4)$$

where Ct is a coefficient of the $n^-$ drift layer thickness.

Figure 6:
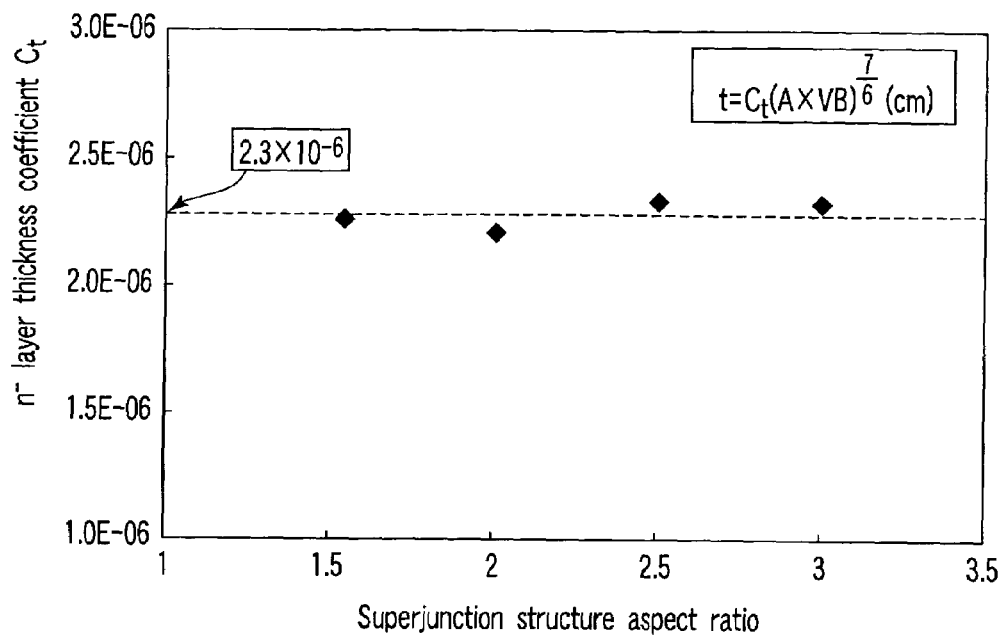
FIG. 6 is a characteristic graph showing the dependency of the N⁻ drift layer thickness t upon the aspect ratio of the superjunction structure in the MOSFET of FIG. 1.

The coefficient Ct of the $n^-$ drift layer thickness is obtained from the $n^-$ drift layer thickness t and the breakdown voltage VB when the layer thickness A takes the maximum value $A_{MAX}$ and then is plotted to obtain the graph of FIG. 6.

FIG. 6 is a characteristic graph showing the dependency of the $n^-$ drift layer thickness t upon the aspect ratio B at the time of the layer thickness ratio $A_{MAX}$ in the MOSFET of FIG. 1.

As is apparent from FIG. 6, Ct takes an almost constant value of $2.3\times10^{-6}$ independently of the aspect ratio B. It follows that the maximum $n^-$ drift layer thickness tMAX can be obtained. By setting the $n^-$ drift layer thickness at tMAX or less, the resultant superjunction MOSFET attains the on-resistance lower than a conventional superjunction MOSFET. Taking a process margin of about 10% into consideration, the $n^-$ drift layer thickness t is desirably represented by:

$$t<2.53\times10^{-6}\times(A\times VB)^{7/6} \text{ (cm)} \quad (5).$$

Furthermore, the drift-layer concentration Nd of a conventional power MOSFET is known to be represented by a function of the breakdown voltage VB:

$$Nd=D\times VB^{-4/3} \text{ (cm}^{-3}) \quad (6)$$

where D is a constant.

When the aforementioned equation (6) is modified so as to fit the MOSFET of this embodiment in the same manner as in the case of the drift layer thickness, the following equation is obtained:

$$Nn=Dn\times(A\times VB)^{-4/3} \text{ (cm}^{-3}) \quad (7)$$

where Dn is the coefficient of the impurity concentration of the $n^-$ drift layer.

Figure 7:
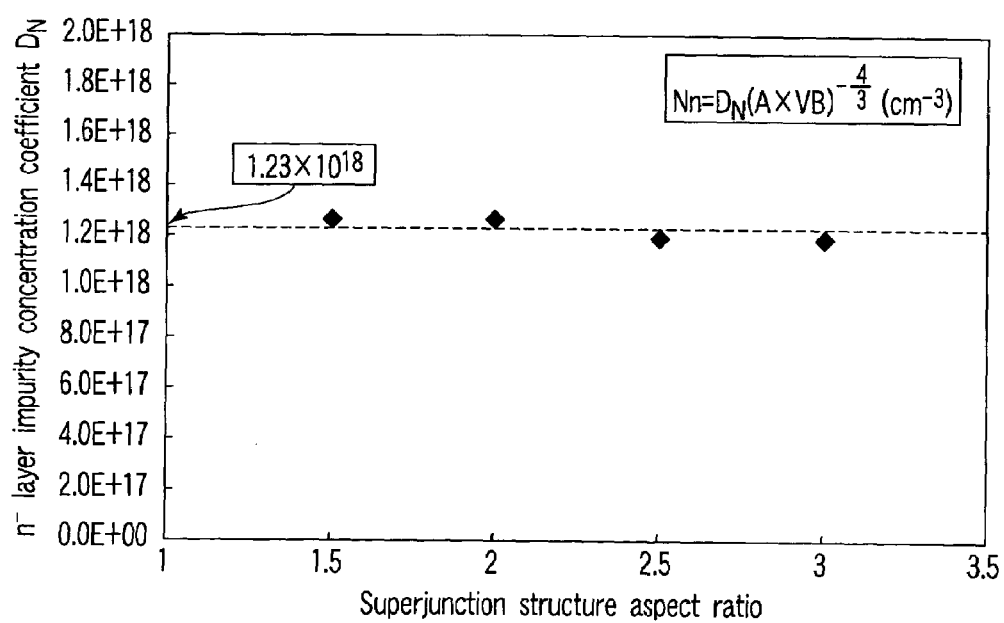
FIG. 7 is a characteristic graph showing the dependency of an n⁻ layer impurity concentration Nn upon the aspect ratio of the superjunction structure in the MOSFET of FIG. 1.

The coefficient Dn is obtained by fitting the values of Nn and VB where the layer thickness ratio is $A_{MAX}$ (maximum value) and plotted to obtain FIG. 7.

FIG. 7 is a characteristic graph showing the dependency of an n⁻ layer impurity concentration Nn upon the aspect ratio of the superjunction structure in the MOSFET of FIG. 1.

As is apparent form FIG. 7, the coefficient Dn takes an almost constant value of $1.23 \times 10^{18}$ independently of the aspect ratio similarly to the coefficient Ct of the n⁻ drift layer thickness. It is therefore possible to obtain $Nn_{MAX}$ (the maximum impurity concentration of the n⁻ drift layer). By setting the n⁻ drift layer impurity concentration at $Nn_{MAX}$ or more, the resultant superjunction MOSFET can exhibit the on-resistance lower than the conventional one. Taking a process margin of about 10% into consideration, Nn can be desirably expressed by:

$$Nn > 1.11 \times 10^{18} \times (A \times VB)^{-4/3} \text{ (cm}^{-3}) \tag{8}$$

When a device having a breakdown voltage of about 600 V was designed by using these equations, the following facts can be obtained. Taking a margin into consideration, the breakdown voltage was set at 700 V. When the aspect ratio B is set at 2, the layer thickness ratio A is set at a value within the range between 0 or more and 0.57 or less (1.15/2) as shown in FIG. 3. In the similar manner, the layer thickness ratio Aopt exhibiting the lowest on-resistance is 0.325 (=0.65/2) as shown in FIG. 5. As a result, the thickness t and impurity concentration Nn of the n⁻ drift layer 2 are:

$$t < 27.2 \text{ μm}$$

$$Nn > 3.8 \times 10^{14} \text{ cm}^{-3}; \text{ and}$$

the most optimum thickness t and the impurity concentration Nn of the n⁻ drift layer 2 are:

$$t = 14.1 \text{ μm}$$

$$Nn = 8 \times 10^{14} \text{ cm}^{-3}.$$

By performing an optimum designing of the device in a desirable manner as mentioned above, the lowest on-resistance can be attained. The effect obtained here is the same as obtained by increasing the aspect ratio B by 0.5 larger than a conventional superjunction MOSFET. More specifically, the desirably designed power MOSFET of this embodiment having the aspect ratio B=2 has the same on-resistance as a conventional one having an aspect ratio B=2.5.

From the foregoing, when a superjunction structure is formed by repeating the ion implantation/epitaxial growth many times, the same on-resistance as that of a conventional power MOSFET can be obtained in the power MOSFET according to this embodiment even if the repeat number of the growth steps is reduced by one, for example.

<Second Embodiment>

Figure 8:
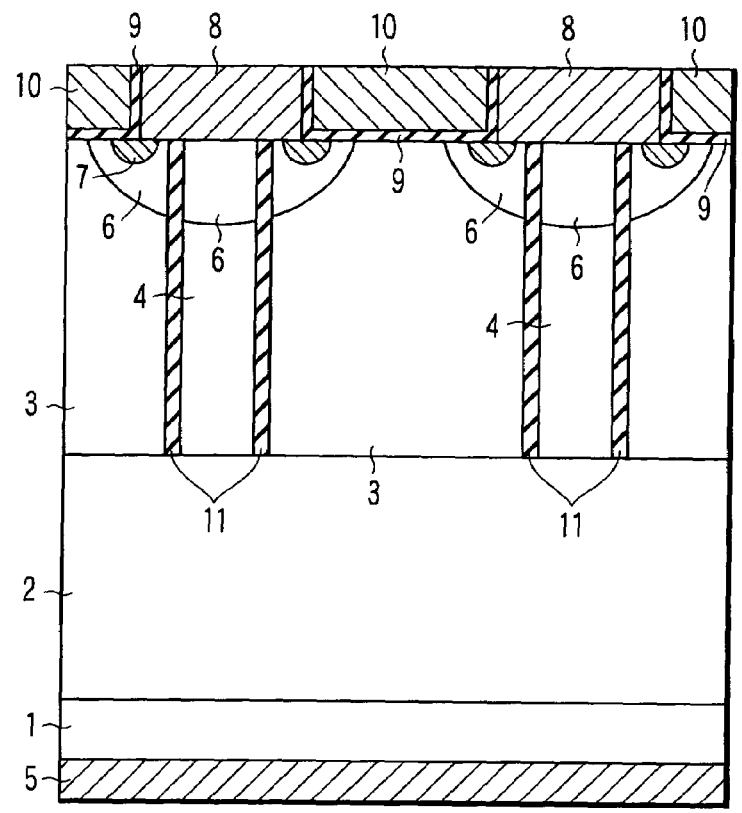
FIG. 8 is a schematic sectional view showing a vertical-type power MOSFET structure having a superjunction structure according to a second embodiment of the present invention.

FIG. 8 is a schematic sectional view showing a vertical-type power MOSFET structure having a RESURF structure formed therein according to a second embodiment of the present invention.

The MOSFET of FIG. 8 differs from that of FIG. 1 only in that insulating films 11 are present between the n-type pillar layer 3 and the p-type pillars 4 forming the superjunction structure in the drift layer. Like reference numerals are used in FIG. 8 to designate like structural elements shown in FIG. 1 and further explanation thereof is omitted. Note that the insulating films 11 are formed so as to partly pass through the p-base layers 6. The p-base layers 6 are uniformly held at the same potential as the source electrodes 8 since the source electrodes 8 are in contact with the p-base layers 6.

When the thickness of the insulating films 11 is thin to some extent in the structure, even if a high voltage is applied between the first main electrode (drain electrode 5) and the second main electrode (source electrodes 8), the depletion layers in the superjunction structure (formed of the n-type pillar layer 3 and the p-type pillars 4) is fully formed, so that the breakdown voltage does not decrease. In addition, since the width of the depletion layers between the n-type pillar layer 3 and the p-type pillars 4 decreases, the on-resistance further decreases.

The impurities within the p-type pillars 4 are prevented from diffusing by the insertion of the insulating film 11. As a result, the superjunction structure having a high aspect ratio B can be easily formed.

Figure 9:
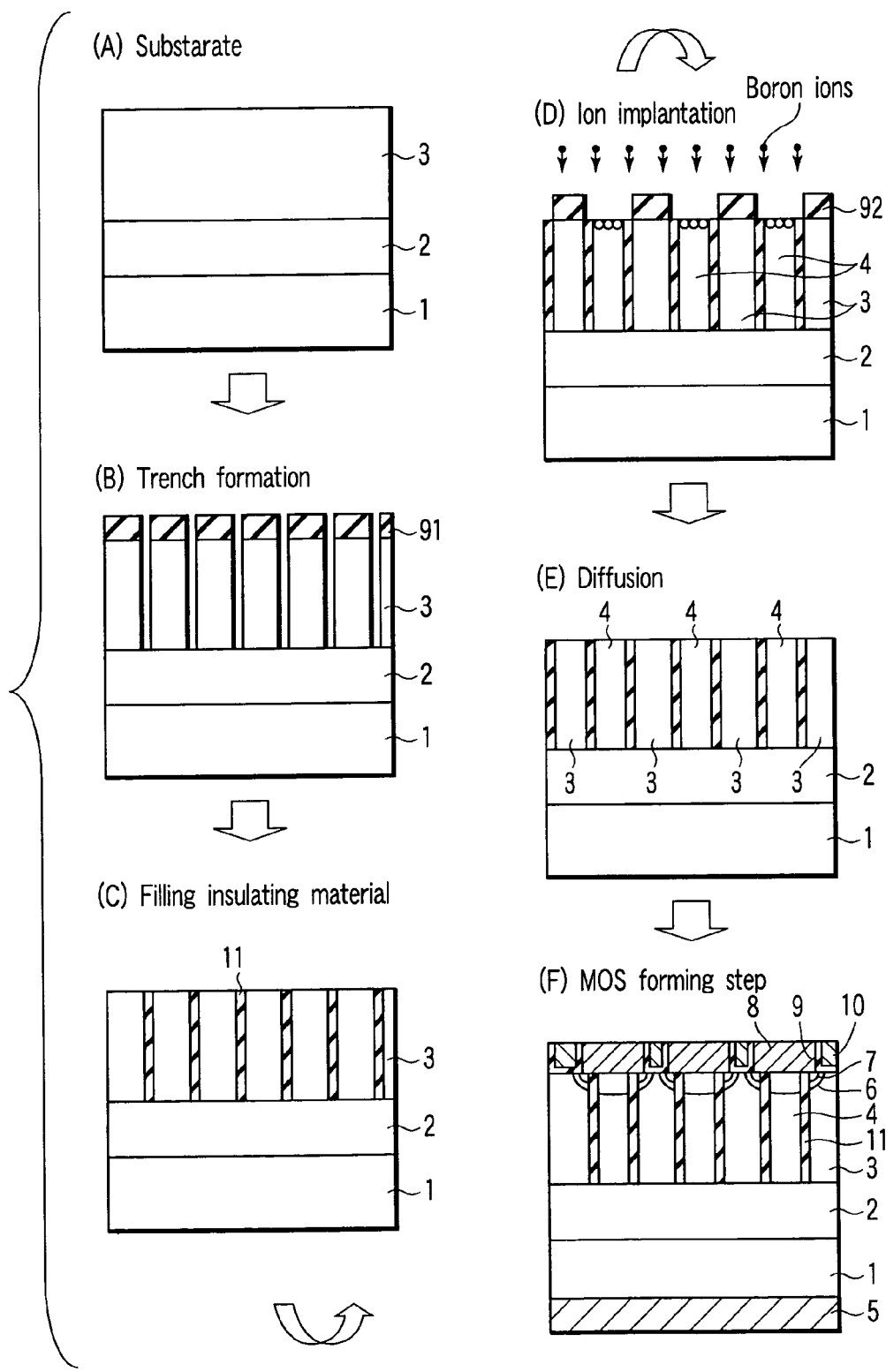
FIG. 9 shows inclusively schematic sectional views showing a process flow for manufacturing the MOSFET of FIG. 8.

FIG. 9 shows inclusively schematic sectional views showing a process flow for manufacturing the MOSFET of FIG. 8.

First, as shown in (A) in FIG. 9, an epitaxial wafer (silicon wafer) comprising an n-type pillar layer 3 of a predetermined impurity concentration and an n⁻ drift layer 2 of an impurity concentration lower than that of the pillar layer 3 is prepared. Then, as shown in (B) in FIG. 9, trenches are formed in the n-type pillar layer 3 for inserting an insulating material therein using a mask pattern 91. After the trenches are filled with the insulating material 11, the mask pattern 91 is removed by CMP as shown in (C) in FIG. 9.

Subsequently, as shown in (D) in FIG. 9, boron ions are selectively implanted using a mask pattern 92 and then allowed to diffuse to form the p-type pillars 4 as shown in (E) in FIG. 9. During the diffusion process, lateral diffusion of boron ions does not occur within the region 3 isolated by the insulating material 11. As a result, p-type pillars 4 having a high aspect ratio are obtained. Thereafter, the mask pattern 92 is removed by the CMP process and a MOSFET structure is formed in the surface region of the n-type pillar layer 3 as shown in (F) in FIG. 9 in the similar manner as in FIG. 8.

Figure 10:
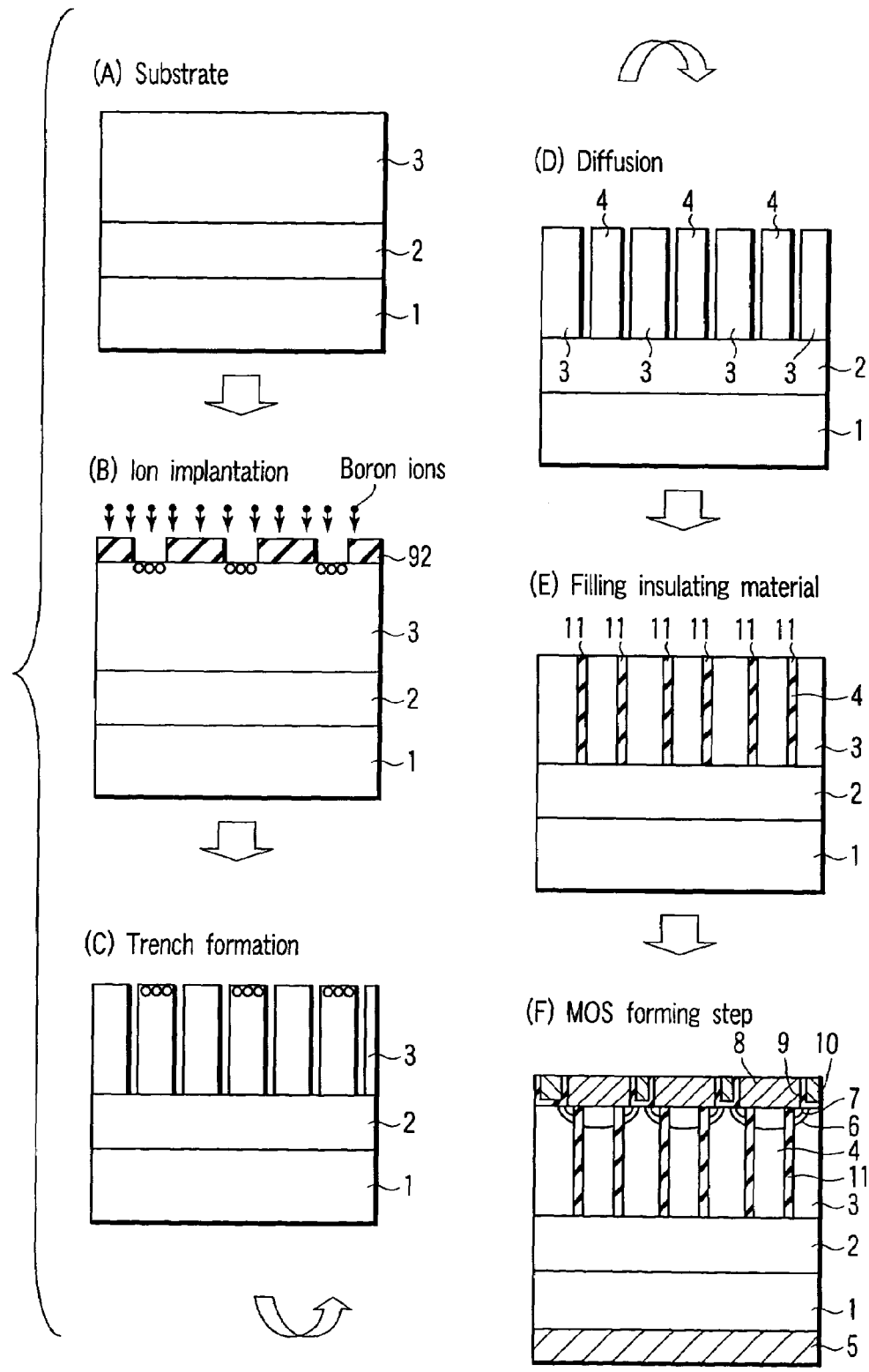
FIG. 10 shows inclusively schematic sectional views showing another process flow for manufacturing the MOSFET of FIG. 8.

FIG. 10 shows inclusively schematic sectional views showing another process flow for manufacturing the MOSFET of FIG. 8.

First, as shown in (A) in FIG. 10, an epitaxial wafer is prepared which comprises an n-type pillar layer 3 of a predetermined impurity concentration and an n⁻ drift layer 2 of lower impurity concentration than that of the pillar layer 3. To form p-type pillars, boron ions are selectively implanted on the surface of the n-type pillar layer 3, by using a mask pattern 92 as shown in (B) in FIG. 10. Thereafter, the mask pattern 92 is removed and trenches are formed for inserting an insulating material therein as shown in (C) in FIG. 10.

Subsequently, as shown in (D) in FIG. 10, the implanted boron ions are allowed to diffuse into the pillars 4. During the diffusion process, lateral diffusion of boron does not occur within the region 3 isolated by the trenches. As a result, p-type pillars 4 having a high aspect ratio are formed. Thereafter, as shown in (E) in FIG. 10, the trenches are filled with an insulating material 11 and a MOSFET structure is formed on the surface region of the layer 3 as shown in (F) in FIG. 10.

In the process flow shown in FIG. 9 or FIG. 10, only the p-type pillars 4 are formed by ion implantation or injection. However, the n-type pillar layer 3 may also be formed by implanting phosphorus ions. Further, impurities may be diffused into the pillars 4 by isolating the pillar layer by an oxide film formed on the trench sidewall or the wafer surface. Furthermore, the insulating material to be inserted in the trenches may be a thermal oxide material, oxide deposition material or nitride deposition material.

Figure 11:
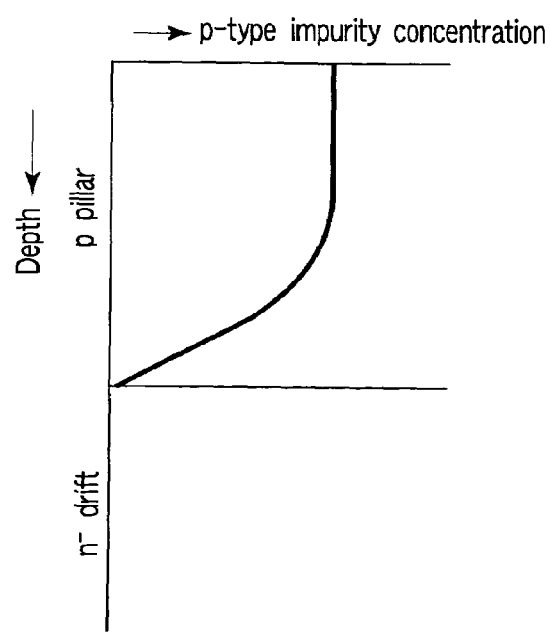
FIG. 11 shows an impurity concentration profile of the p-type pillar layer 4 formed in the process shown in FIG. 9 or FIG. 10 with depth.

FIG. 11 shows the p-type impurity concentration profile in the p-type pillars 4 formed in the process shown in FIG. 9 or FIG. 10 in the depth direction of the wafer or pillar.

The n-type pillar layer 3 of FIG. 9 or FIG. 10, if it is to be formed with a depth of about 10 μm, can be formed by a single epitaxial growth step with a constant impurity concentration. In contrast, when the p-type pillars 4 are formed in accordance with the process flow described above by referring to FIGS. 9 and 10, the impurity concentration of the pillars 4 is gradually and continuously reduced with depth. In the similar manner, when the n-type pillar layer 3 of FIG. 8 is formed by diffusion, it will have the same impurity profile as that of the p-type pillars 4.

Figure 12:
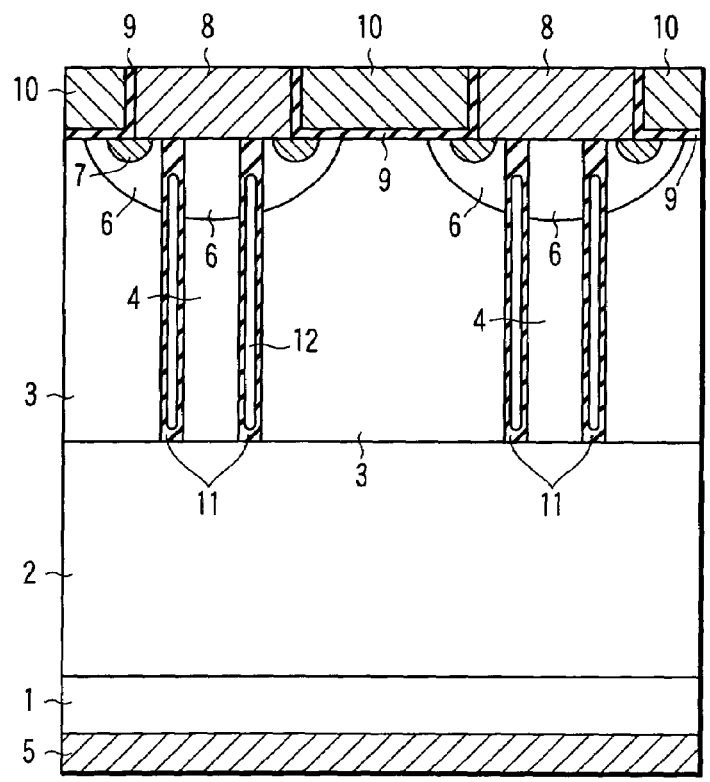
FIG. 12 is a schematic sectional view showing a vertical-type power MOSFET structure having a superjunction structure according to a modified second embodiment of the present invention.

It is not necessary to completely fill the trenches with the insulating material 11. Voids may be present within the insulating material as shown in FIG. 12. When the insulating material 11 is deposited in the trench having a high aspect ratio, an abnormal growth or deposition sometimes occurs at a mesa corner. As long as non-defective passivation film e.g., oxide film is formed on the trench sidewall, the insulating material having voids therein is free from electric isolation problems.

Furthermore, in place of completely filling the trench with the insulating material 11, a single continuous void or discontinuous voids may be present along the border between the n-type pillar layer 3 and p-type pillars 4. Even if a void or voids are present, almost the same effects as in the trench filled with the insulating material 11 can be obtained.

<Third Embodiment>

Figure 13:
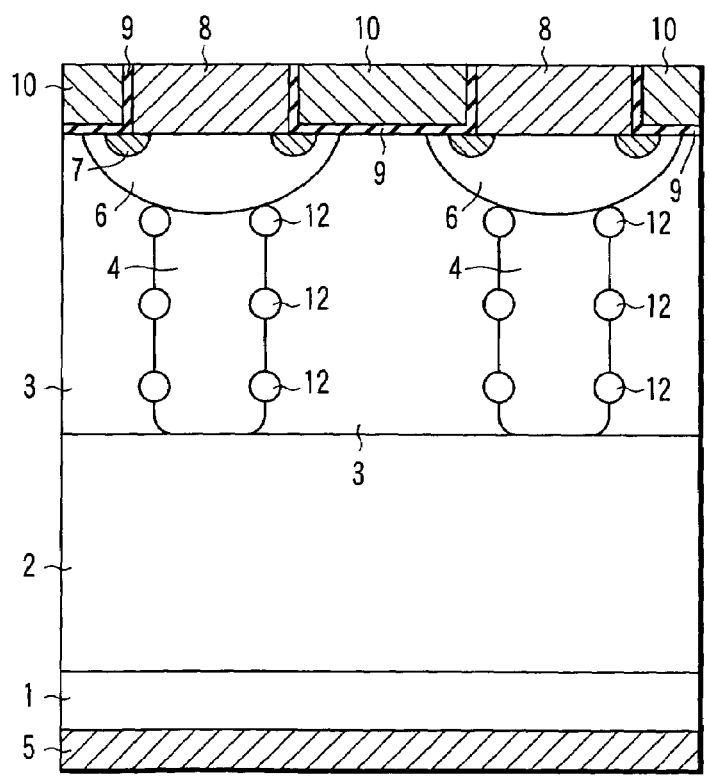
FIG. 13 is a schematic sectional view showing a vertical-type power MOSFET structure having a superjunction structure according to a third embodiment of the present invention.

FIG. 13 is a schematic sectional view showing a vertical-type power MOSFET structure having a RESURF structure according to a third embodiment of the present invention.

The MOSFET differs from that of FIG. 1 in that discontinuous voids are arranged along the border between the n-type pillar layer 3 and the p-type pillars 4 forming the superjunction structure in the drift layer. Like reference numerals are used in FIG. 13 to designate like structural elements of FIG. 1 and further explanation thereof is omitted.

The voids 12 work as the insulating films 11 used in the power MOSFET of the second embodiment. The breakdown voltage is not lowered and the lateral size of the depletion layers is reduced by the presence of the voids. Therefore, the on-resistance of the MOSFET decreases.

The structure having the sectional view shown in FIG. 13 can be formed by employing a process for forming a superjunction having a high aspect ratio.

Figure 14:
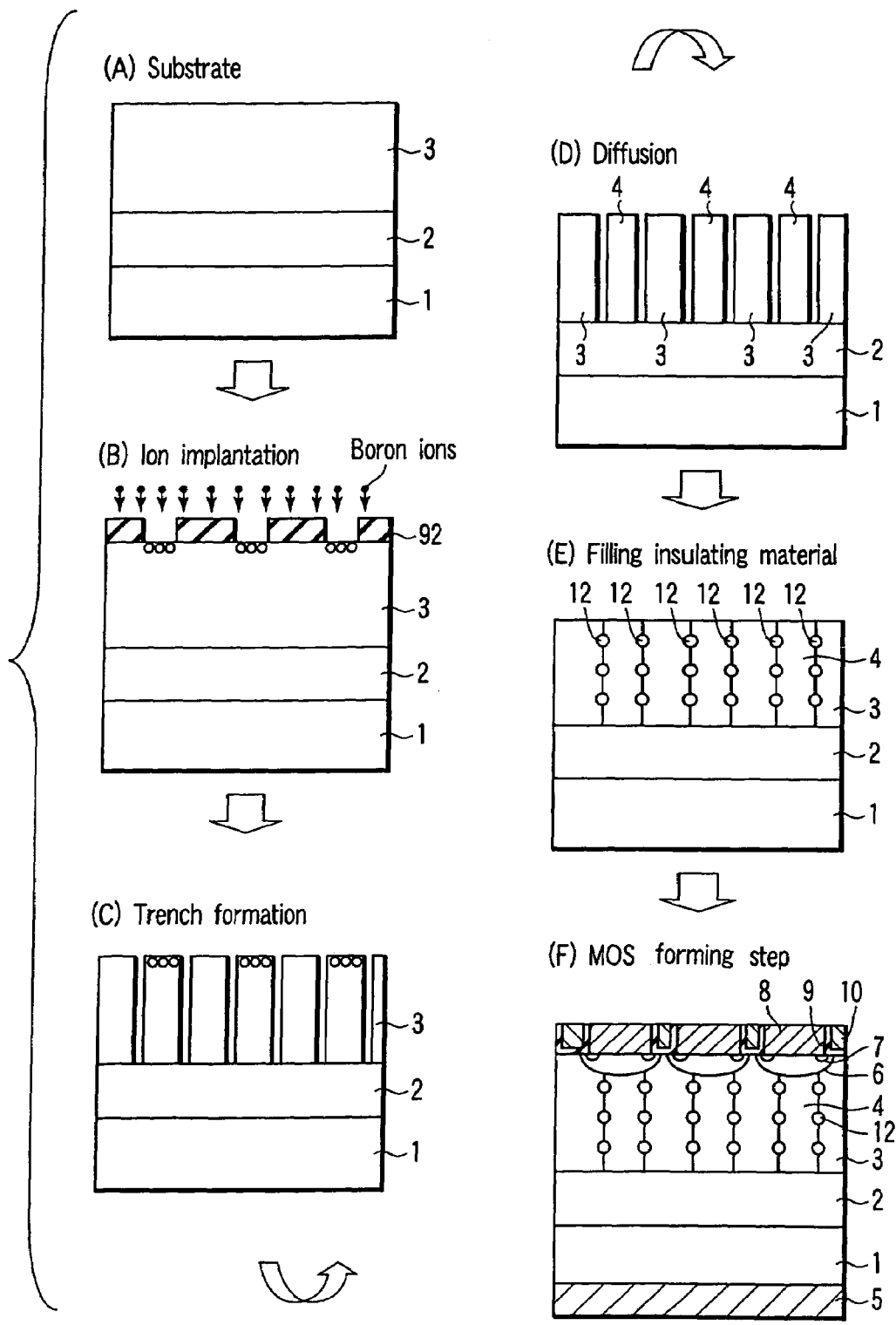
FIG. 14 shows inclusively schematic sectional views showing a process flow for manufacturing the MOSFET shown in FIG. 13.
Figure 15:
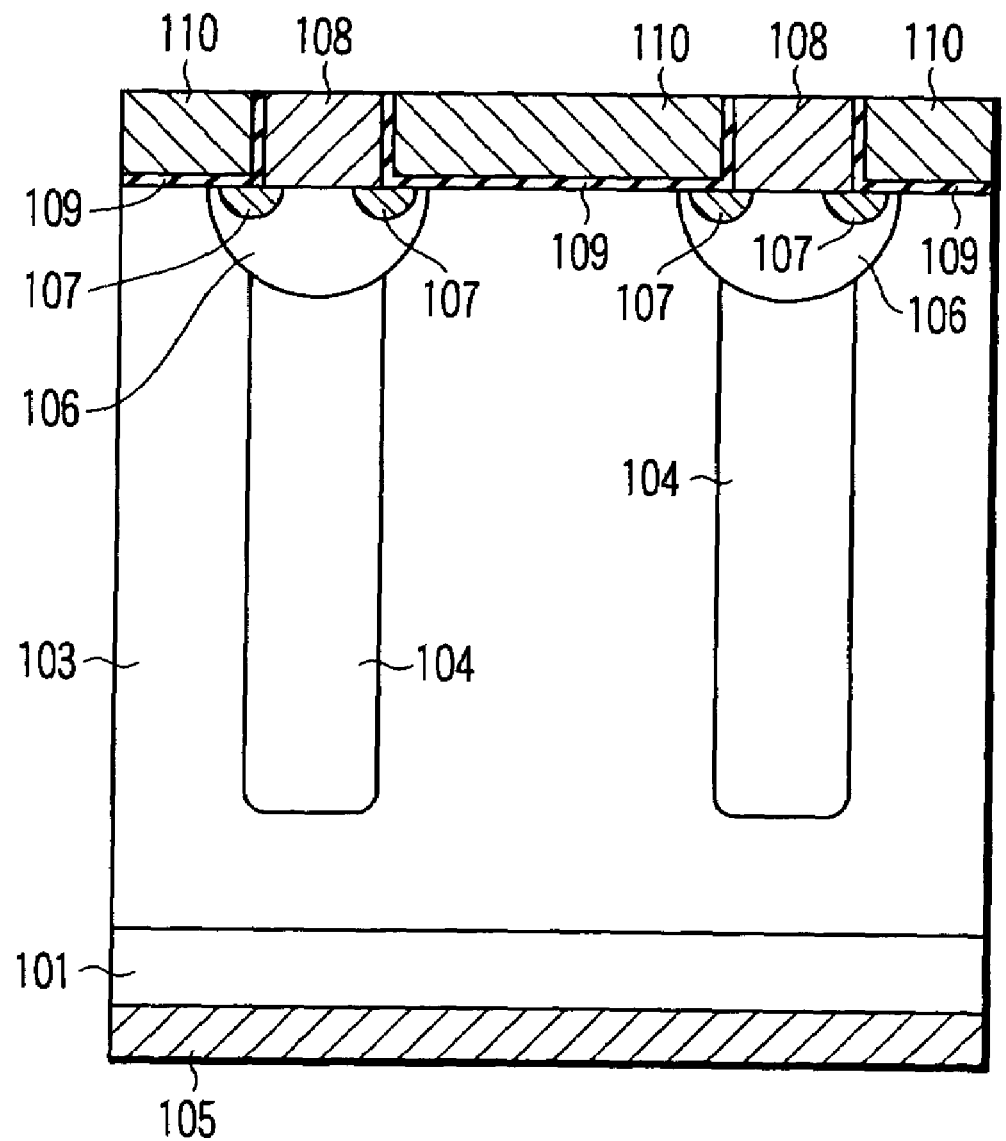
FIG. 15 is a schematic sectional view showing a vertical-type power MOSFET structure having a conventional superjunction structure.

FIG. 14 shows inclusively schematic sectional views showing a process flow for manufacturing the MOSFET of FIG. 13.

At first, an epitaxial wafer comprising two layers including an n-type pillar layer 3 of a predetermined impurity concentration and an n⁻ type drift layer 2 of an impurity concentration lower than that of the pillar layer 3 is prepared as shown in (A) in FIG. 14. Subsequently, as shown in (B) in FIG. 14, boron ions are selectively implanted by using a mask pattern 92 to form the p-type pillars 4 in the surface region of the n-type pillar layer 3. Thereafter, trenches for inserting the insulating material are formed and the implanted boron ions are allowed to diffuse as shown in (C) in FIG. 14. During the diffusion process, lateral diffusion of boron ions does not occur within the regions 3 isolated by the trenches. As a result, p-type pillars 4 having a high aspect ratio are formed as shown in (D) in FIG. 14.

Thereafter, the resultant construction is subjected to thermal treatment performed in a hydrogen atmosphere. Si atoms of the trench sidewall flow and are deposited in the trench with voids 12 formed therein as shown in (E) in FIG. 14. As a result, the surface thus obtained becomes flat. Afterward, a MOSFET structure is formed on the surface region of the layer 3 as shown in (F) in FIG. 14.

In the process flow shown in FIG. 14, the p-type pillars 4 alone are formed by ion implantation. However, the n-type pillar layer 3 may also be formed by implanting phosphorus ions. Furthermore, when the impurity ions are diffused to form the pillars 4, an oxide film may be formed on the trench sidewall or the wafer surface to isolate the pillars from the pillar layer 3. Since the number of voids is determined mostly by the width of the trench, the number of voids may be single or plural.

In the p-type pillars 4 formed in the process shown in FIG. 14, the impurity concentration gradually and continuously decreases with depth by diffusion. If the n-type pillar layer 3 is also formed by diffusion, a similar impurity concentration profile will be obtained in the similar manner as that of the p-type pillars 4, as shown in FIG. 11.

The present invention is not limited to the embodiments previously mentioned. These embodiments may be modified in various ways by one skilled in the art. All modifications fall in the scope of the present invention.

For example, in the explanation given above, the first conductivity type is assumed as an n-type and the second conductivity type as a p-type. However, the present invention can be carried out even if the first conductivity type is a p-type and the second conductivity type is an n-type.

The pattern of the p-type pillars 4 in the plan view may not be limited to a stripe. A lattice pattern and staggered pattern are also acceptable.

The plan-view pattern of each of the p-base layers, the n-source layer 7 and the gate electrode 10 is not limited to a stripe. A lattice pattern and staggered pattern may be used. The stripe pattern may be arranged in parallel or perpendicular to the superjunction structure.

The MOS gate structure is not limited to the planar structure mentioned above and a trench structure may be used.

The semiconductor is not limited to Si. A wide band gap semiconductor such as diamond or a compound semiconductor such as silicon carbide (SiC), gallium nitride (GaN), or aluminum nitride (AlN) may be used.

The present invention is not limited to the power MOSFET. For example, a semiconductor such as SBD, MPS diode, a MOSFET/SBD mixed device, SIT, JFET, or IGBT may be used as long as it has a superjunction structure.

According to the present invention, a power MOSFET capable of attaining on-resistance lower than a device having a conventional superjunction structure. As a result, a power MOSFET using a wafer of low cost or an inexpensive chip can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor device, comprising:
a first semiconductor layer of a first conductivity type;
a second semiconductor layer of the first conductivity type and a third semiconductor layer of a second conductivity type which are alternately and laterally arranged on the first semiconductor layer;
a first main electrode electrically in contact with the first semiconductor layer;
a fourth semiconductor layer of the second conductivity type selectively formed in surface regions of the second and third semiconductor layers;
a fifth semiconductor layer of the first conductivity type selectively formed in a surface region of the fourth semiconductor layer;
a second main electrode formed in contact with surfaces of the fourth and fifth semiconductor layers; and
a control electrode formed on surfaces of the second, fourth and fifth semiconductor layers,
wherein an impurity concentration of the first semiconductor layer is lower than that of the second semiconductor layer; and a layer thickness ratio A is given by an expression:

$$0 < A = t/(t+d) \leq 0.72$$

where t is a thickness of the first semiconductor layer, and d is a thickness of the second semiconductor layer; and
wherein a void is present in a border region between the second semiconductor layer and the third semiconductor layer.

2. A semiconductor device according to claim 1, wherein a plurality of voids are present independently along the border region.

3. A semiconductor device according to claim 1, wherein an impurity concentration profile of at least one of the second semiconductor layer and the third semiconductor layer gradually reduces with depth.

4. A power semiconductor device, comprising:
a first semiconductor layer of a first conductivity type;
a second semiconductor layer of the first conductivity type and at least two third semiconductor layers of a second conductivity type which are alternately and laterally arranged on the first semiconductor layer;
a first main electrode electrically in contact with the first semiconductor layer;
a fourth semiconductor layer of the second conductivity type selectively formed in surface regions of the second and third semiconductor layers;
a fifth semiconductor layer of the first conductivity type selectively formed in a surface region of the fourth semiconductor layer;
a second main electrode formed in contact with surfaces of the fourth and fifth semiconductor layers; and
a control electrode formed on surfaces of the second, fourth and fifth semiconductor layers,
wherein an impurity concentration of the first semiconductor layer is lower than that of the second semiconductor layer; and a layer thickness ratio A is given by an expression:

$$0 < A = t/(t+d) < 0.72$$

where t is a thickness of the first semiconductor layer, and d is a thickness of the second semiconductor layer;
wherein insulating films are interposed between the second semiconductor layer and third semiconductor layers; and
wherein a void is present in said insulating films.

5. A semiconductor device according to claim 4, wherein an impurity concentration profile of at least one of the second semiconductor layer and the at least two third semiconductor layers gradually reduces with depth.

6. A semiconductor device according to claim 4, wherein an impurity concentration profile of at least one of the second semiconductor layer and the third semiconductor layer gradually reduces with depth.

7. A power semiconductor device, comprising:
a first semiconductor layer of a first conductivity type;
a second semiconductor layer of the first conductivity type and at least two third semiconductor layers of a second conductivity type which are alternately and laterally arranged on the first semiconductor layer;
a first main electrode electrically in contact with the first semiconductor layer;
a fourth semiconductor layer of the second conductivity type selectively formed in surface regions of the second and third semiconductor layers;
a fifth semiconductor layer of the first conductivity type selectively formed in a surface region of the fourth semiconductor layer;
a second main electrode formed in contact with surfaces of the fourth and fifth semiconductor layers; and
a control electrode formed on surfaces of the second, fourth and fifth semiconductor layers,
wherein an impurity concentration of the first semiconductor layer is lower than that of the second semiconductor layer; and a layer thickness ratio A is given by an expression:

$$0 < A = t/(t+d) < 0.72$$

where t is a thickness of the first semiconductor layer, and d is a thickness of the second semiconductor layer;
wherein insulating films are interposed between the second semiconductor layer and third semiconductor layers; and
wherein an impurity concentration profile of at least one of the second semiconductor layer and the at least two third semiconductor layers gradually reduces with depth.

8. A power semiconductor device, comprising:
a first semiconductor layer of a first conductivity type;
a second semiconductor layer of the first conductivity type and a third semiconductor layer of a second conductivity type which are alternately and laterally arranged on the first semiconductor layer;
a first main electrode electrically in contact with the first semiconductor layer;
a fourth semiconductor layer of the second conductivity type selectively formed in surface regions of the second and third semiconductor layers;
a fifth semiconductor layer of the first conductivity type selectively formed in a surface region of the fourth semiconductor layer;
a second main electrode formed in contact with surfaces of the fourth and fifth semiconductor layers; and
a control electrode formed on surfaces of the second, fourth and fifth semiconductor layers,
wherein an impurity concentration of the first semiconductor layer is lower than that of the second semiconductor layer; and a layer thickness ratio A is given by an expression:

$$0 < A = t/(t+d) \leq 0.72$$

where t is a thickness of the first semiconductor layer, and d is a thickness of the second semiconductor layer; and wherein assuming that a breakdown voltage is represented by VB (V), then t, VB (V), and A satisfy a relationship below:

$t < 2.53 \times 10^{-6} \times (A \times VB)^{7/6}$ (cm), wherein the first to fifth semiconductor layers are constituted by a silicon layer, wherein a void is present in a border region between the second semiconductor layer and the third semiconductor layer, and wherein a void is present in said insulating material.

9. A semiconductor device according to claim 8, wherein an impurity concentration profile of at least one of the second semiconductor layer and the third semiconductor layer gradually reduces with depth.

10. A power semiconductor device, comprising:
a first semiconductor layer of a first conductivity type;
a second semiconductor layer of the first conductivity type and a third semiconductor layer of a second conductivity type which are alternately and laterally arranged on the first semiconductor layer;
a first main electrode electrically in contact with the first semiconductor layer;
a fourth semiconductor layer of the second conductivity type selectively formed in surface regions of the second and third semiconductor layers;
a fifth semiconductor layer of the first conductivity type selectively formed in a surface region of the fourth semiconductor layer;
a second main electrode formed in contact with surfaces of the fourth and fifth semiconductor layers; and
a control electrode formed on surfaces of the second, fourth and fifth semiconductor layers,
wherein an impurity concentration of the first semiconductor layer is lower than that of the second semiconductor layer; and a layer thickness ratio A is given by an expression:

$0 < A = t/(t+d) \leq 0.72$ where t is a thickness of the first semiconductor layer, and d is a thickness of the second semiconductor layer; and
wherein assuming that a breakdown voltage is represented by VB (V), then t, VB (V), and A satisfy a relationship below:

$t < 2.53 \times 10^{-6} \times (A \times VB)^{7/6}$ (cm), wherein the first to fifth semiconductor layers are constituted by a silicon layer, wherein a void is present in a border region between the second semiconductor layer and the third semiconductor layer.

11. A semiconductor device according to claim 10, wherein, assuming that an aspect ratio B is represented by B=d/w, where w is an interval between adjacent third semiconductor layers, the layer thickness ratio A and the aspect ratio B satisfy an expression below:

$A \times B \leq 1.15$.

12. A semiconductor device according to claim 11, wherein an impurity concentration profile of at least one of the second semiconductor layer and the third semiconductor layer gradually reduces with depth.

13. A semiconductor device according to claim 10, wherein an aspect ratio B and the layer thickness ratio A satisfy an expression below:

$-0.04B + 0.48 < (A \times B) < 0.13B + 0.59$ where the aspect ratio B is represented by B=d/w, and w is an interval between adjacent third semiconductor layers.

14. A semiconductor device according to claim 13, wherein, assuming that an impurity concentration of the first semiconductor layer is represented by Nn and that a breakdown voltage is represented by VB (V), then Nn, VB (V), and A satisfy the relationship below:

$Nn > 1.11 \times 10^{18} \times (A \times VB)^{-4/3}$ (cm$^{-3}$).

15. A semiconductor device according to claim 14, wherein an impurity concentration profile of at least one of the second semiconductor layer and the third semiconductor layer gradually reduces with depth.

16. A semiconductor device according to claim 13, wherein an impurity concentration profile of at least one of the second semiconductor layer and the third semiconductor layer gradually reduces with depth.

17. A semiconductor device according to claim 10, wherein a product of A×B satisfies a relationship below:

$0.58 < (A \times B) 0.71$ wherein B denotes the an aspect ratio represented by B=d/w, where w is an interval between adjacent third semiconductor layers.

18. A semiconductor device according to claim 17, wherein an impurity concentration profile of at least one of the second semiconductor layer and the third semiconductor layer gradually reduces with depth.

19. A semiconductor device according to claim 10, wherein an insulating material is interposed between the second semiconductor layer and the third semiconductor layer.

20. A semiconductor device according to claim 10, wherein a void is present in said insulating material.

21. A semiconductor device according to claim 20, wherein an impurity concentration profile of at least one of the second semiconductor layer and the third semiconductor layer gradually reduces with depth.

22. A semiconductor device according to claim 19, wherein an impurity concentration profile of at least one of the second semiconductor layer and the third semiconductor layer gradually reduces with depth.

23. A semiconductor device according to claim 19, wherein, assuming that an aspect ratio B is represented by B=d/w, where w is an interval between adjacent third semiconductor layers, the layer thickness ratio A and the aspect ratio B satisfy an expression below:

$A \times B \leq 1.15$.

24. A semiconductor device according to claim 10, wherein an impurity concentration profile of at least one of the second semiconductor layer and the third semiconductor layer gradually reduces with depth.

25. A semiconductor device according to claim 10, wherein a plurality of voids are present independently along the border region.

26. A semiconductor device according to claim 25, wherein an impurity concentration profile of at least one of the second semiconductor layer and the third semiconductor layer gradually reduces with depth.

27. A semiconductor device according to claim 10, wherein an impurity concentration profile of at least one of the second semiconductor layer and the third semiconductor layer gradually reduces with depth.

* * * * *